United States Patent [19]

Talmadge

[11] Patent Number: 5,121,008
[45] Date of Patent: Jun. 9, 1992

[54] CIRCUIT FOR GENERATING OR DEMODULATING A SQUARE WAVE AND OTHER WAVE FORMS

[76] Inventor: Paul C. Talmadge, 78 Woodbridge Ave., Ansonia, Conn. 06401

[21] Appl. No.: 619,579

[22] Filed: Nov. 29, 1990

[51] Int. Cl.[5] .............................................. G06G 7/12
[52] U.S. Cl. ................................. 307/493; 307/261; 307/264; 307/490; 328/26
[58] Field of Search ............... 307/261, 262, 269, 490, 307/493; 328/2 C

[56] References Cited

U.S. PATENT DOCUMENTS

| | | | |
|---|---|---|---|
| Re. 28.579 | 10/1975 | Uchida | 307/493 |
| 3,619,663 | 11/1971 | Molnar | 307/262 |
| 3,898,447 | 8/1975 | Bozarth, Jr. | 307/246 |
| 4,334,195 | 6/1982 | Luce | 307/264 |
| 4,341,962 | 7/1982 | Buff | 307/493 |
| 4,438,354 | 3/1984 | Haque et al. | 307/493 |
| 4,450,365 | 5/1984 | Hoff, Jr. et al. | 307/262 |
| 4,550,263 | 10/1985 | Layton | 307/261 |
| 4,717,848 | 1/1988 | Rabaey et al. | 307/264 |
| 4,940,904 | 7/1990 | Lin | 307/262 |

FOREIGN PATENT DOCUMENTS 0266455  3/1989  Fed. Rep. of Germany ...... 307/493

OTHER PUBLICATIONS

"Pulse Amplifier with Digital Gain Control"; Instrum. & Exp. Tech.; Nov. 1979.
Analog Devices; Linear Products Data Book; 1988; pp. 9-15, 9-16.
Horowitz, Paul et al.; The Art of Electronics, 2d. ed.; 1989; p. 183.

Primary Examiner—Stanley D. Miller
Assistant Examiner—Terry D. Cunningham
Attorney, Agent, or Firm—Robert H. Whisker; David E. Pitchenik; Melvin J. Scolnick

[57] ABSTRACT

A circuit for modulating or demodulating an input potential includes a first operational amplifier for receiving the input potential and a second operational amplifier for outputting an output potential. A resistor network is connected to the operational amplifiers. A switch with a first position and a second position is connected to the resistor network and to at least one of the operational amplifiers. The circuit also includes a mechanism for repeatedly driving the switch between its first position and its second position. When the switch is in its first position, the output potential equals the input potential. When the switch is in its second position, the output potential equals minus one times the input potential.

22 Claims, 17 Drawing Sheets

CIRCUIT FOR GENERATING OR DEMODULATING A SQUARE WAVE AND OTHER WAVE FORMS

FIELD OF THE INVENTION

This invention relates to a circuit that may be used to generate an AC square wave and other wave forms with high precision and also is suitable for high-precision demodulation of an AC signal and for other purposes.

BACKGROUND OF THE INVENTION

Reference is made to copending patent application ser. no. 07/619,624, filed Nov. 29, 1990, entitled "Square Wave Excitation of a Transducer", filed by the applicant of the present application and assigned to the assignee of the present application. The disclosure of said copending application ser. no. 07/619,624 is hereby incorporated herein by reference.

As stated in said copending application ser. no. 07/619,624 it is advantageous to excite a strain gauge in a force measuring device by an AC square wave. However, the precision desired for the force measuring device requires a circuit capable of producing the excitation wave form with greater precision than prior art circuitry.

SUMMARY OF THE INVENTION

According to the invention, a circuit for modulating or demodulating an input potential includes a first amplifying circuit for receiving an input potential, a second amplifying circuit for outputting an output potential, a resistor network connected to the first and second amplifying circuit, and a switch that has a first position and a second position. The switch is connected to the resistor network and to at least one of the amplifying circuits. Changes in the switch's position change the effective gain of at least one of the amplifying circuits. The circuit also includes a device for repeatedly driving the switch between its first and second positions. The output potential is equal to the input potential when the switch is in its first position and is equal to minus one times the input potential when the switch is in its second position.

DETAILED DESCRIPTION OF PREFERRED EMBODIMENTS OF THE SUBJECT INVENTION

Figure 1:
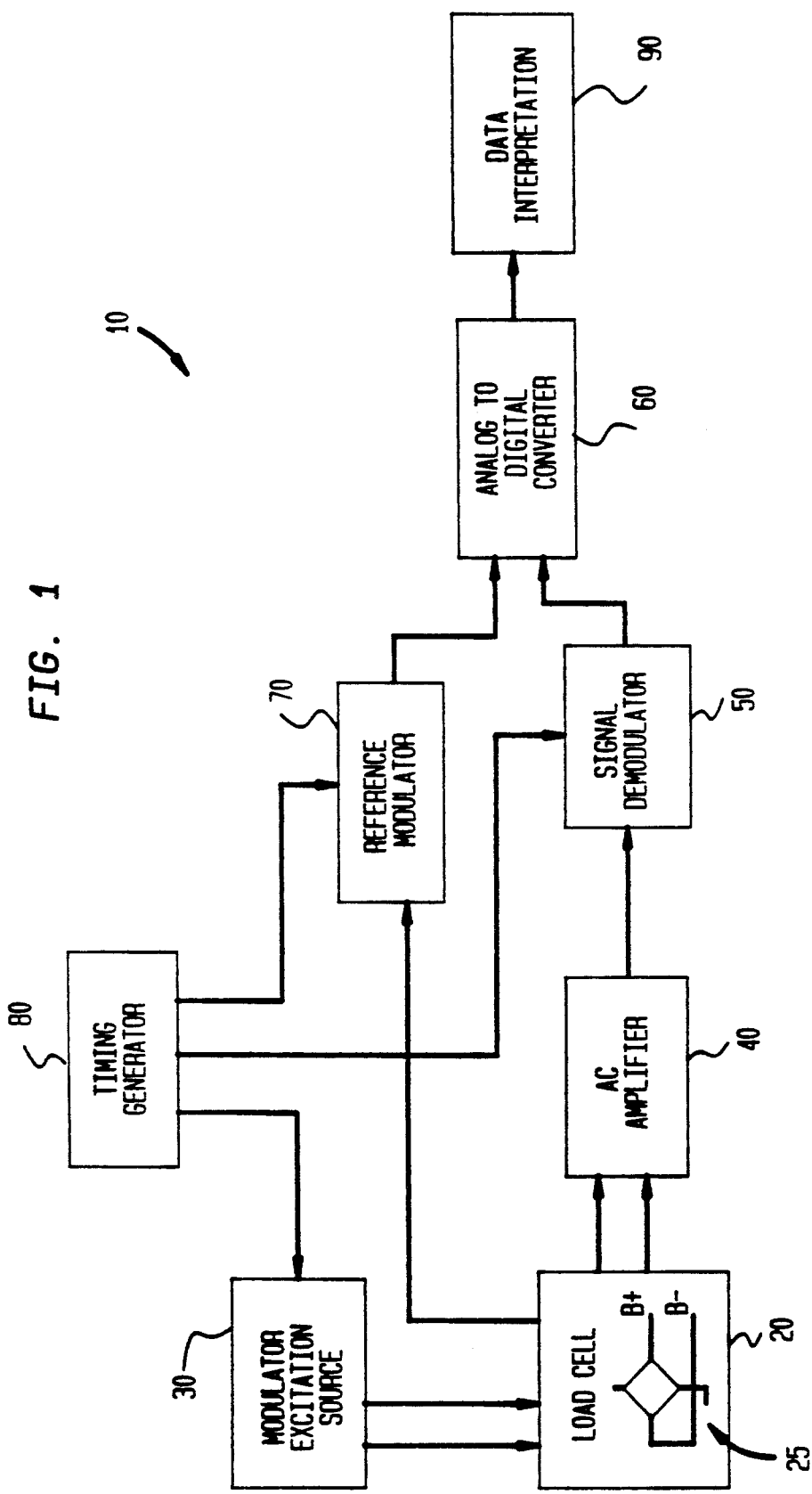
FIG. 1 is a schematic block diagram of the electronic circuitry of a force measuring apparatus that includes a circuit is that is an embodiment of the invention.

An overview will first be presented of a force-measuring device that includes a circuit that is an embodiment of the present invention. FIG. 1 shows in schematic form the major functional blocks of a force-measuring device 10. Device 10 includes load cell 20, which comprises one or more strain gauges arranged in a resistor bridge 25. Load cell 20 maybe, for example, the model PW 2C3 available from Hottinger Baldwin Measurements, Inc., Marlboro, Mass. or the model 1040 available from Tedea, Inc., Canoga Park, Calif. Modulator excitation source 30 converts a precise, stable d.c. voltage into a square wave that is applied in a push-pull arrangement to resistor bridge 25.

The output of resistor bridge 25, reflecting the force applied to load cell 20, is amplified by a.c. amplifier 40, and then demodulated by signal demodulator 50. The d.c. output by signal demodulator 50 is converted into a digital signal by A/D converter 60. The reference voltage for A/D converter 60 is provided by reference demodulator 70, which demodulates the square wave excitation signal that is applied to resistor bridge 25.

Timing signals for modulator excitation source 30, signal demodulator 50 and reference demodulator 70 are provided by timing generator 80. The digital signal output by A/D converter 60 is received by data interpretation circuitry 90.

Figure 2:
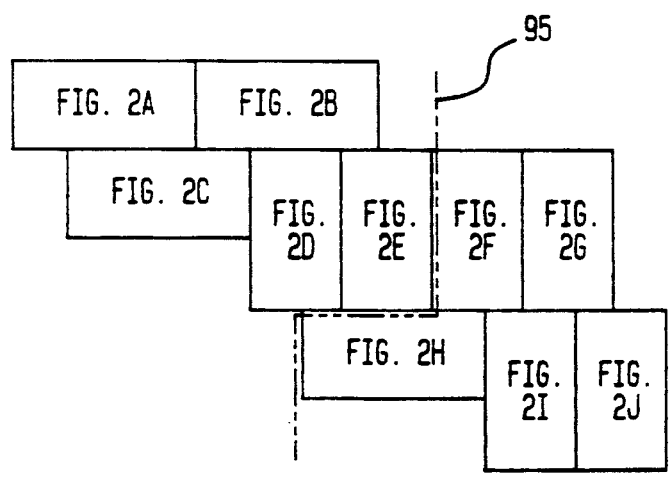
FIG. 2 is an interconnection diagram of FIGS. 2A-2J, which together are a schematic representation of the circuitry of FIG. 1.
Figure 2A:
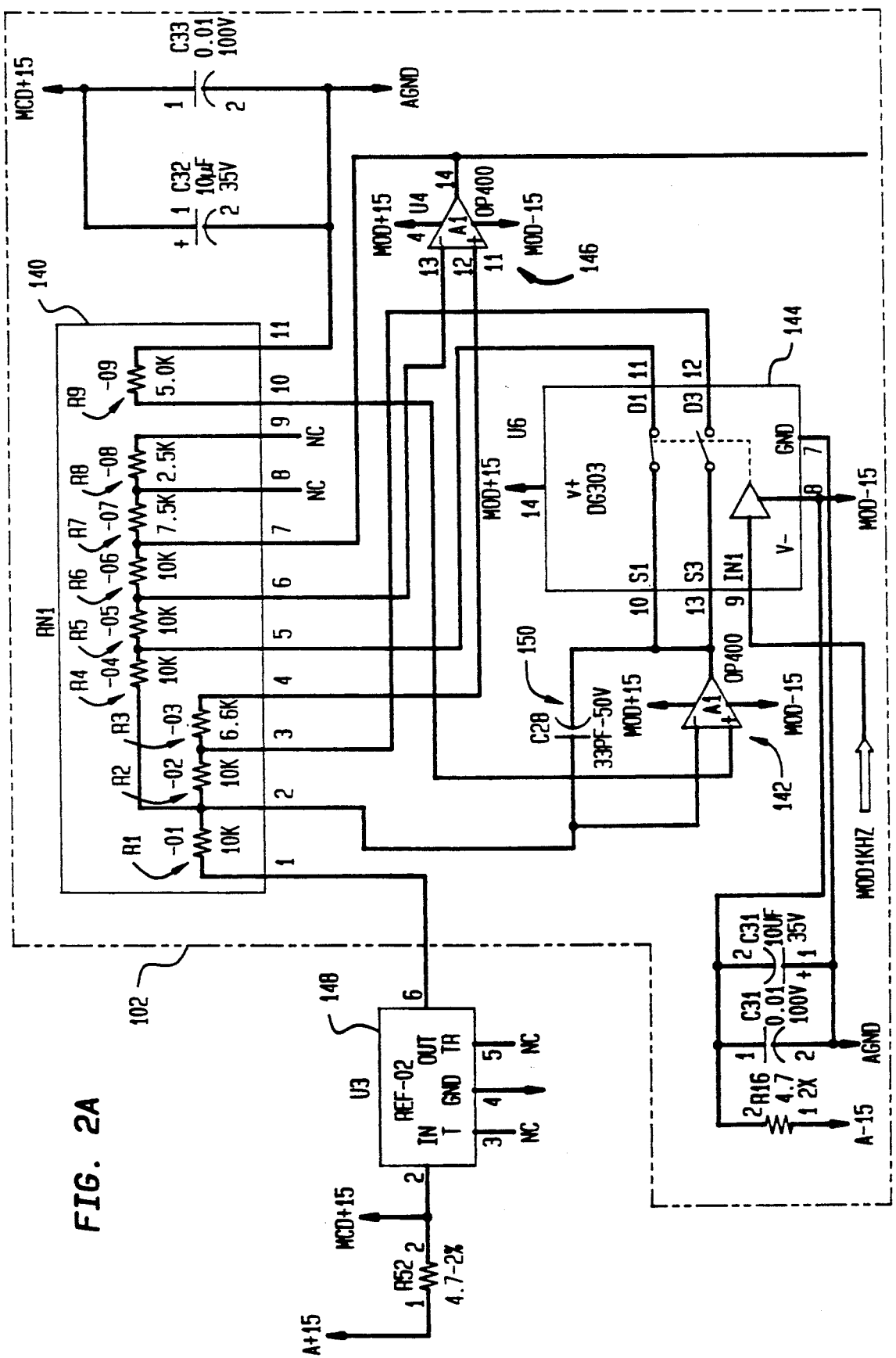
Figure 2B:
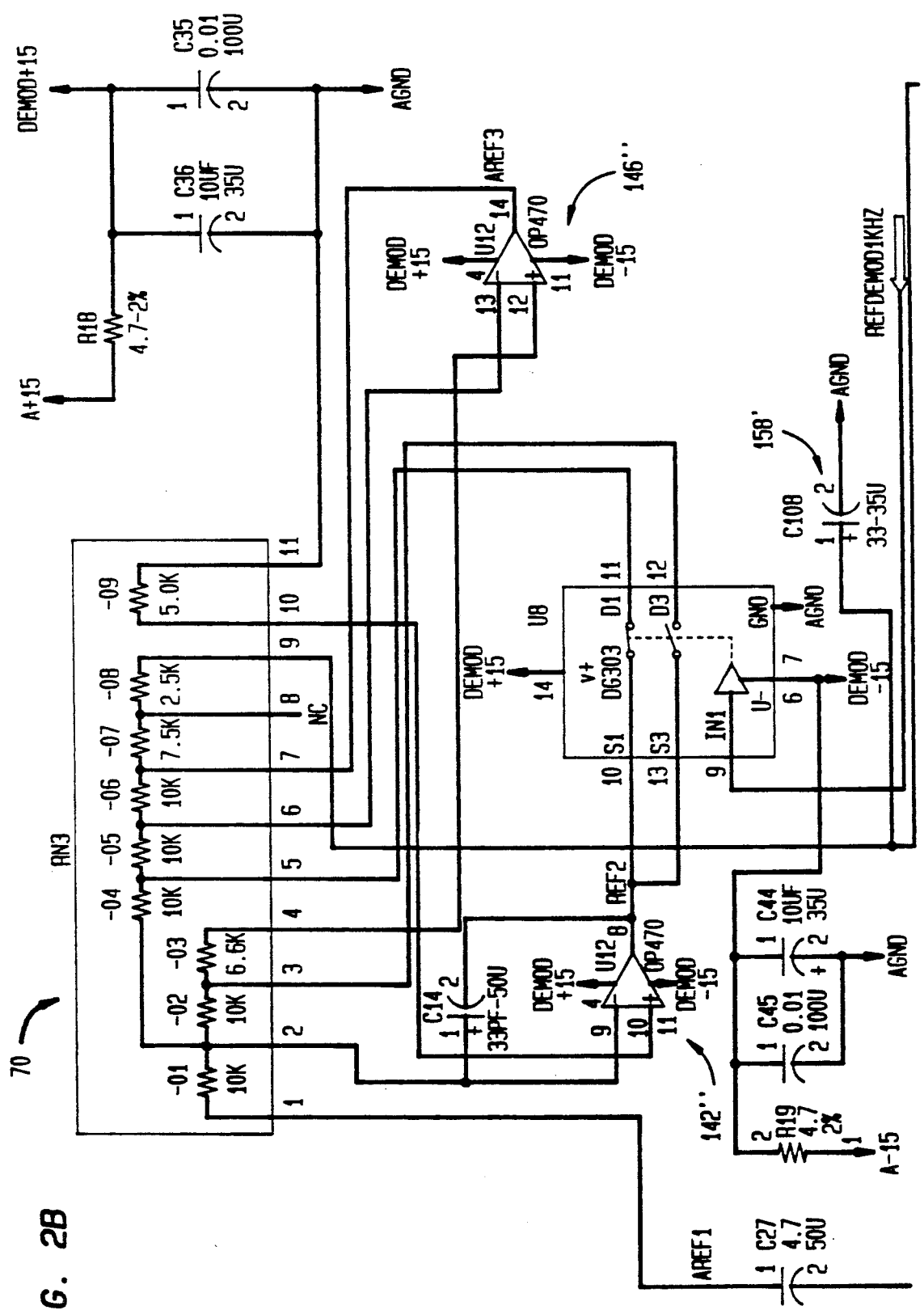
Figure 2C:
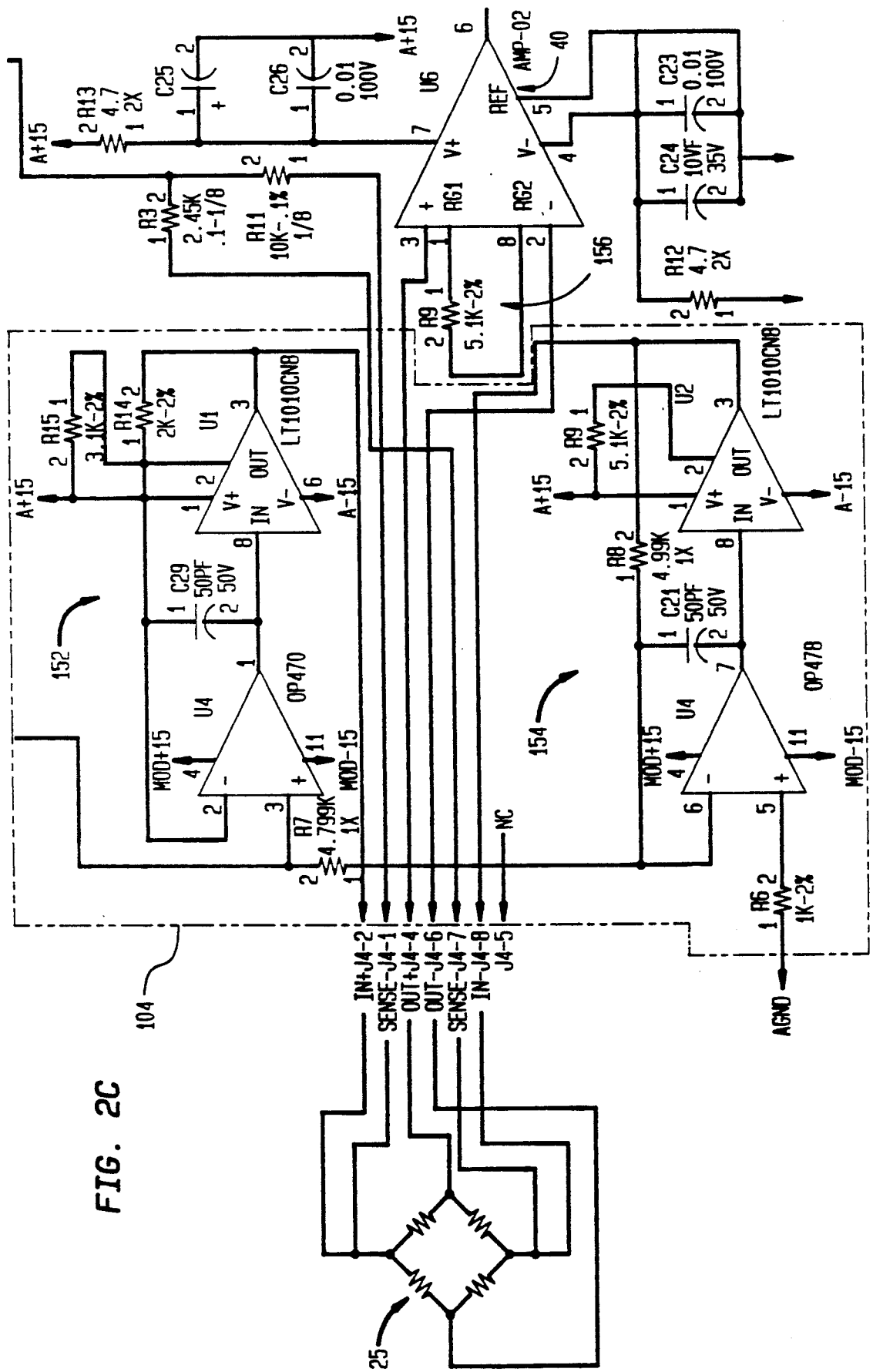
Figure 2D:
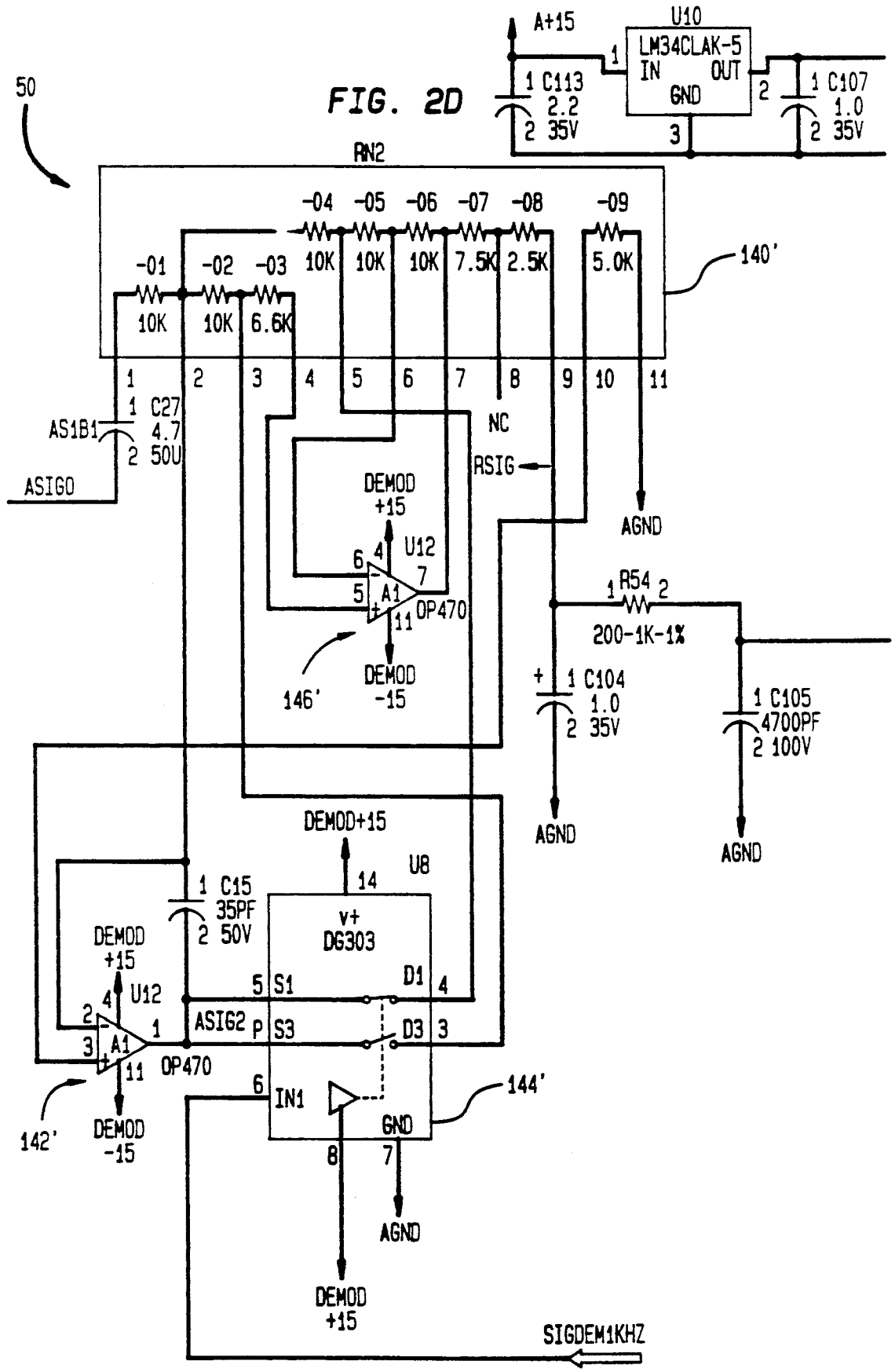
Figure 2E:
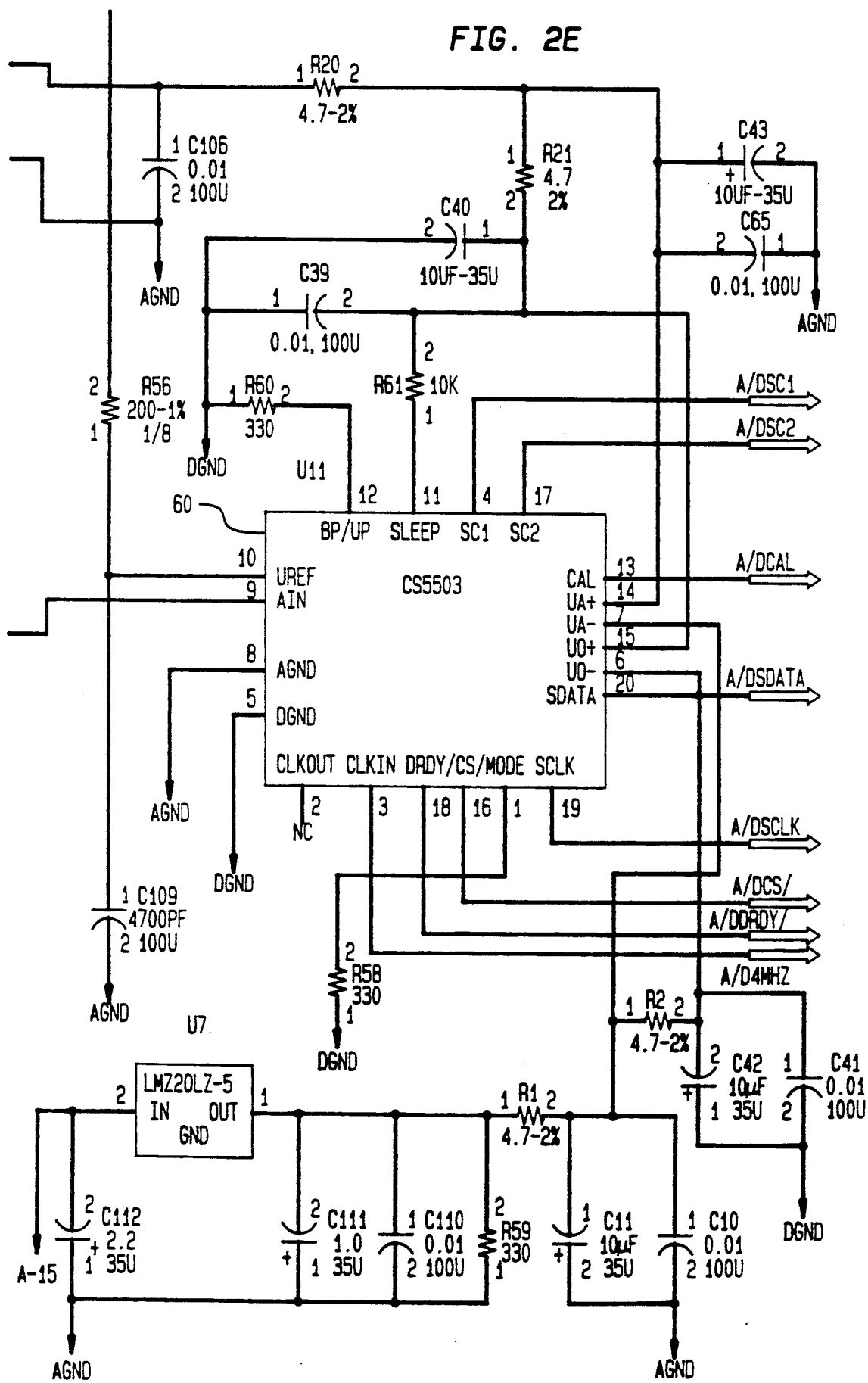

FIGS. 2A-2J illustrate in more detail the circuitry of FIG. 1. Corresponding to modular excitation source 30 of FIG. 1 are modulator circiut 102 (FIG. ba) and push pull amplifier stage 104 (FIG. 2C). Resistor bridge 25 is found on FIG. 2C, a.c. amplifier 40 on FIG. 2C, signal demodulator 50 on FIG. 2D, A/D converter 60 on FIG. 2E, and reference demodulator 70 on FIG. 2B. Timing generator 80 is realized by use of microcontroller 106 (FIG. 2G) also makes up part of the timing generator.

Figure 2F:
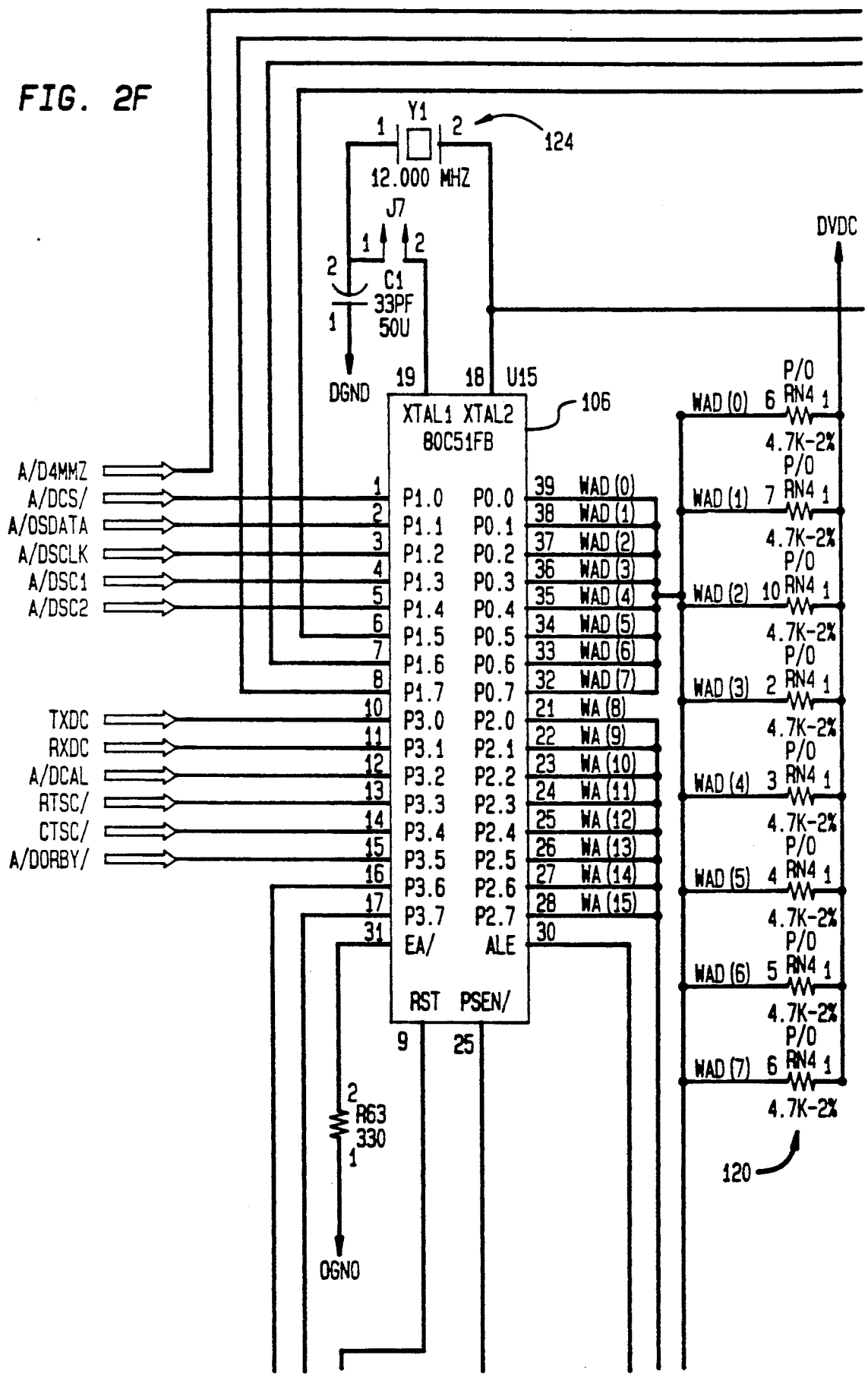
Figure 2G:
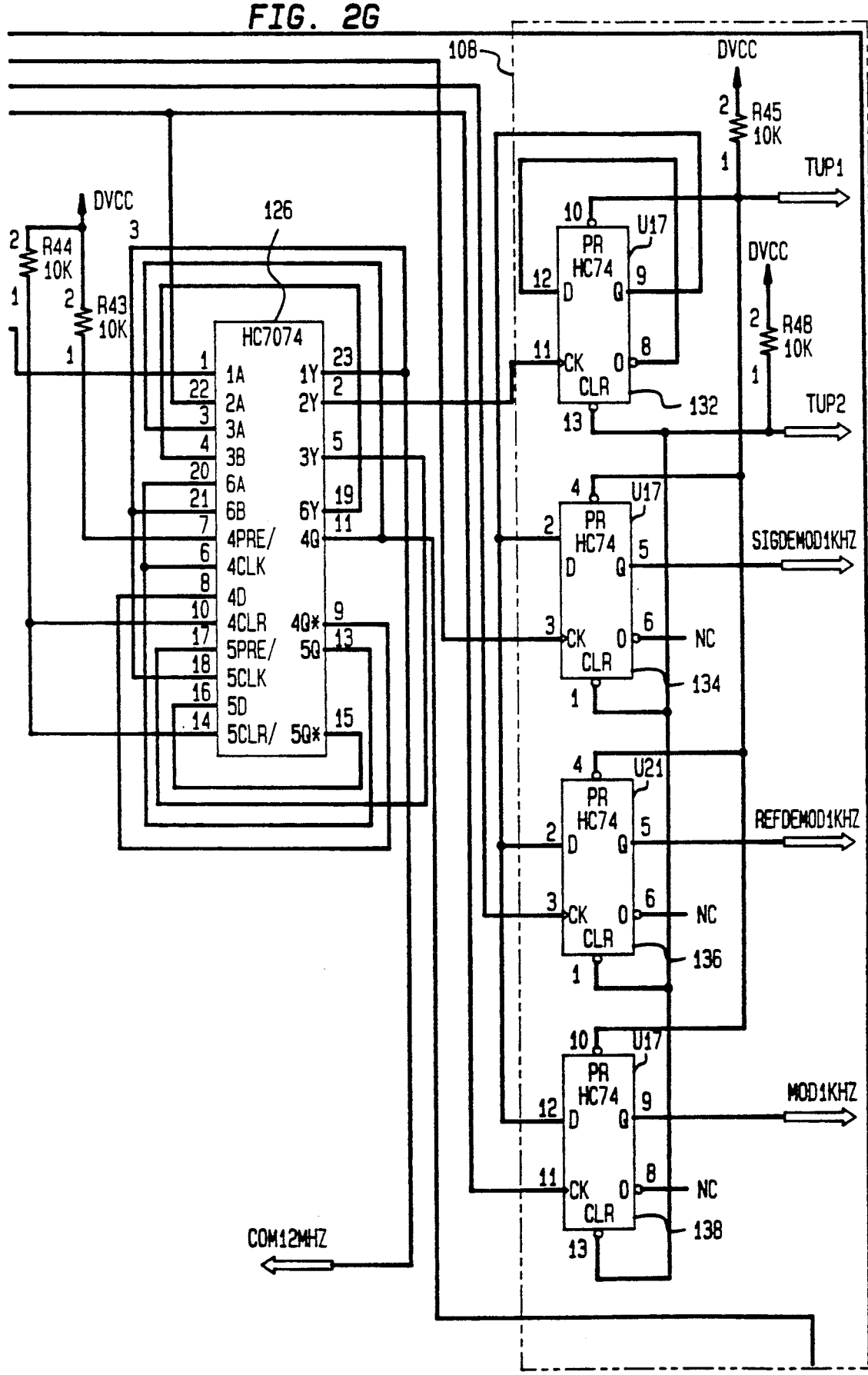
Figure 2H:
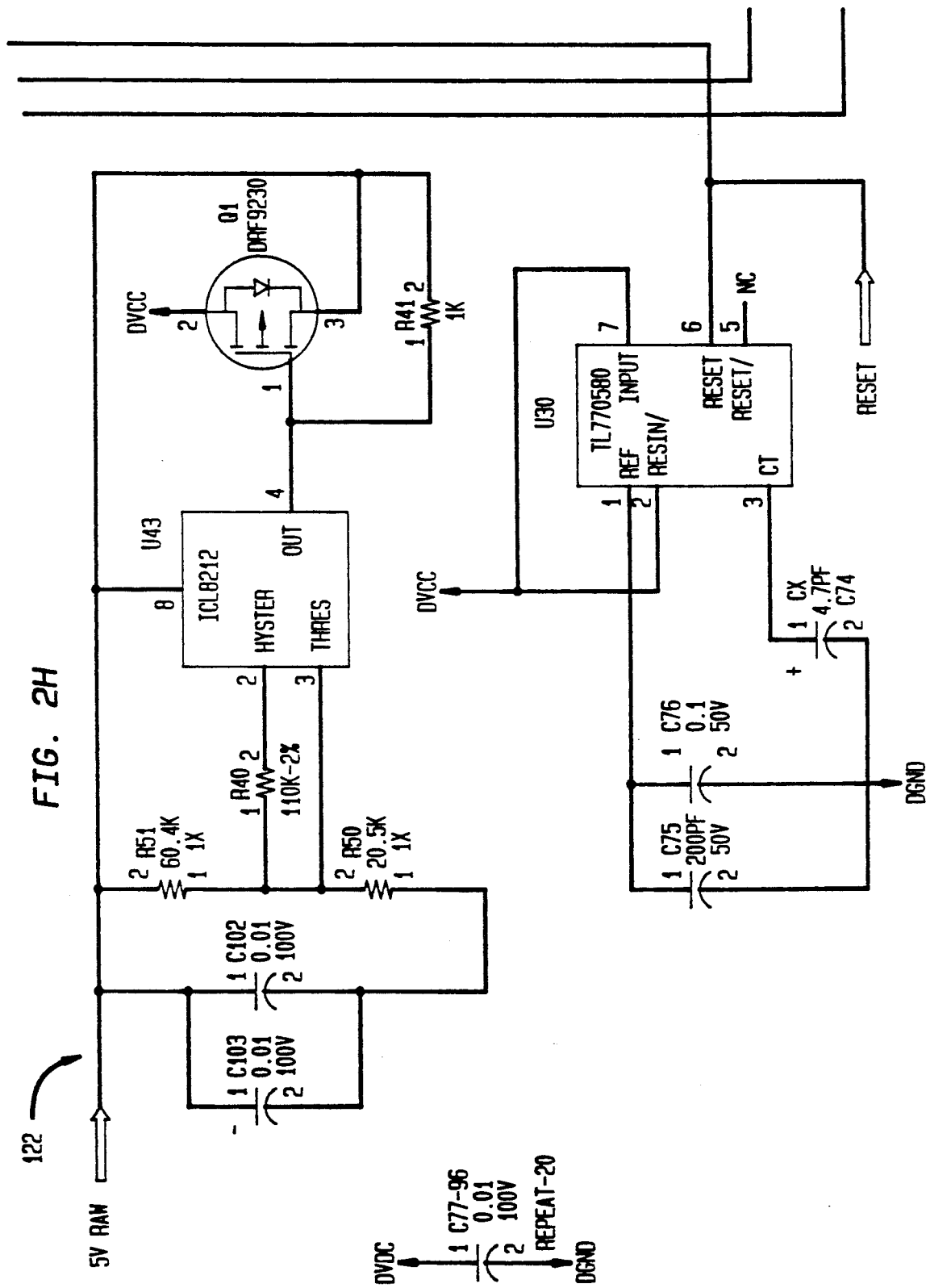
Figure 2I:
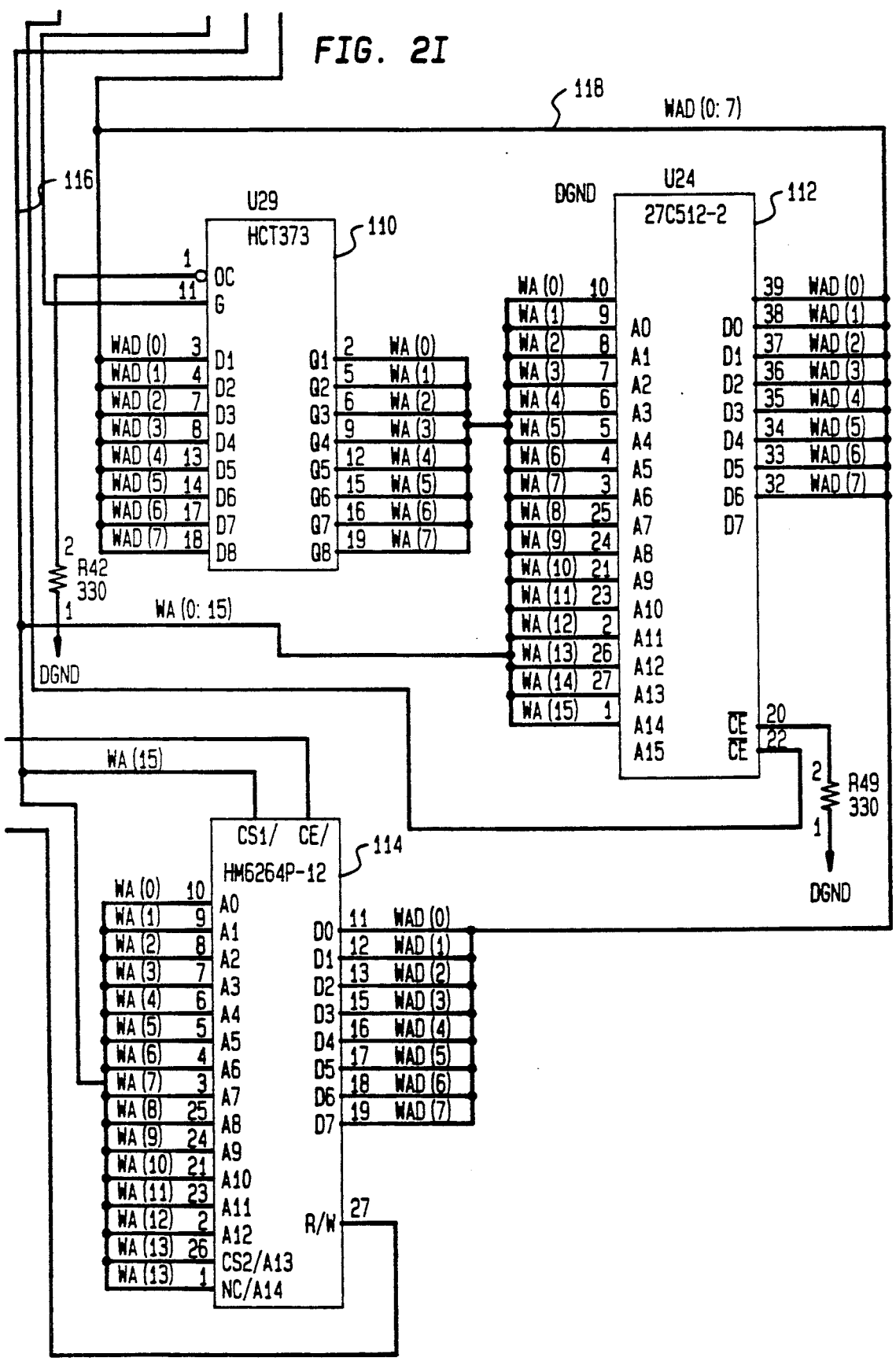

Microcontroller 106 may be, for example, a model 80C51FB available from Intel Corporation, Santa Clara, Calif. Associated with micro controller 106 are address latch 110, program ROM 112, and RAM 114 (FIG. 2I).

Address bus 116 and multiplexed address and data bus 118 interconnect microcontroller 106, latch 110, ROM 112 and RAM 114. Pull-up resistors 120 (FIG. 2F are provided for bus 118. As will be recognized by those skilled in the art, the functions of microcontroller 106, ROM 112 and RAM 114 may alternatively be embodied in a single integrated circiut.

Also associated with microcontroller 106 are conventional start-up control circuitry 122 (FIG. 2H) and a crystal clock source 124 (FIG. 2F). Crystal 124 operates at 12 MHZ in the series resonant mode with a shunt capacitance on either leg for stability. Crystal 124 is the only clock source in device 10, thus eliminating beat frequency noise that might occur if more than one clock were present.

IC 126 (FIG. 2G) is connected to crystal 124 so as to provide a buffer for furnishing the 12 MHZ signal to the rest of the system. The input capacitance of the buffer provides the aforementioned shunt capacitance for one leg of crystal 124. IC 126 also comprises two D-type flip-flops, a NAND gate and a NOR gate arranged as a divide-by-three circuit in order to convert the 12 MHZ clock signal from crystal 124 into a 4 MHZ clock signal required by A/D converter 60. Also receiving the 4

Figure 2J:
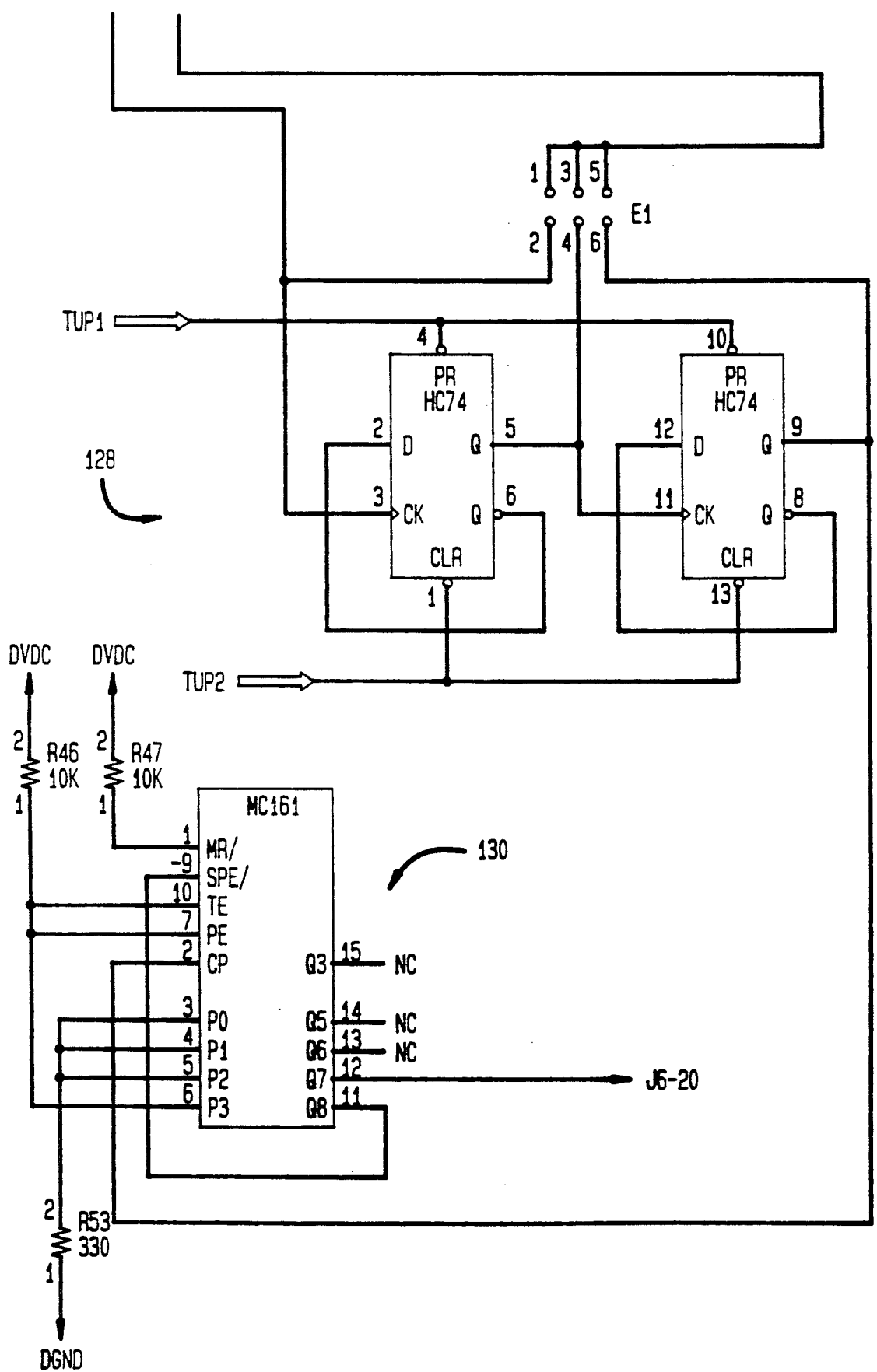

MHZ clock signal are: frequency selector circuit 128 (FIG. 2J), which controls the bandwith for the digital filter of A/D converter 60; and display clock driver 130 (FIG. 2J).

Data interpretation circuitry 90 of FIG. 1 is realized in part by microcontroller 106 which receives the output of A/D converter 60. Microcontroller 106 transmits data to a second microcontroller (not shown) which performs such functions as noise reduction and/or averaging and/or conversion to pounds or kilograms, etc. The second microcontroller may also be interfaced for communication of weight data to a microprocessor or other device that may use the weight data for such purposes as postal rate calculations.

Modulator circuit 102, which is a preferred embodiment of the circuit of the present invention, will now be described. Referring to FIG. 2A, it will be observed that modulator 102 includes precision resistor network 140, a first operational amplifier 142, a switching circuit 144 and a second operational amplifier 146.

Figure 3:
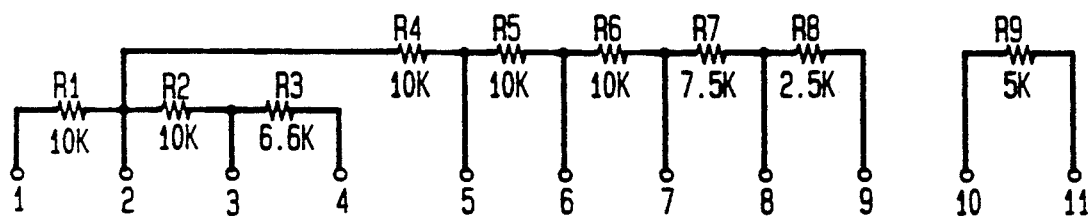
FIG. 3 is a detailed schematic representation of a resistor network making up part of a circuit according to the invention.

As shown in FIG. 3, resistor network 140 comprises resistors R1 through R9. The absolute tolerance of the resistors is 1%. Resistors R1 through R9 are precisely matched with a preferred ratio tolerance of 0.1%. Changes in ratio with temperature are minimized. In a preferred embodiment, the change in ratio with temperature is no more than 5 parts per million per 0° C. over the range 0° C. to +70° C. The stringent tolerance for change in ratio is selected to aid in achieving the desired accuracy for device 10.

Amplifiers 142, 146 are preferably high gain operational amplifiers, with a gain of at least 5 million and may be, for example, model OP400 amplifiers available from Precision Monolithics, Inc., Santa Clara, Calif.

Switch 144 is preferably a double pole single throw FET switch and may be a type DG300 available from Intersil, Inc., Cupertino, Calif. or Harris Semiconductor 144 is connected to resistor network 140, amplifier 142 and (through resistor network 140) to amplifier 146. Switch 144 is in a break before make configuration to eliminate transients. The rise and fall time of switch 144 is rapid, and in a preferred embodiment varies by no more than 12.5 nanoseconds from a nominal 250 nanoseconds over the temperature range of 0° C. to +70° C.

Figure 4A:
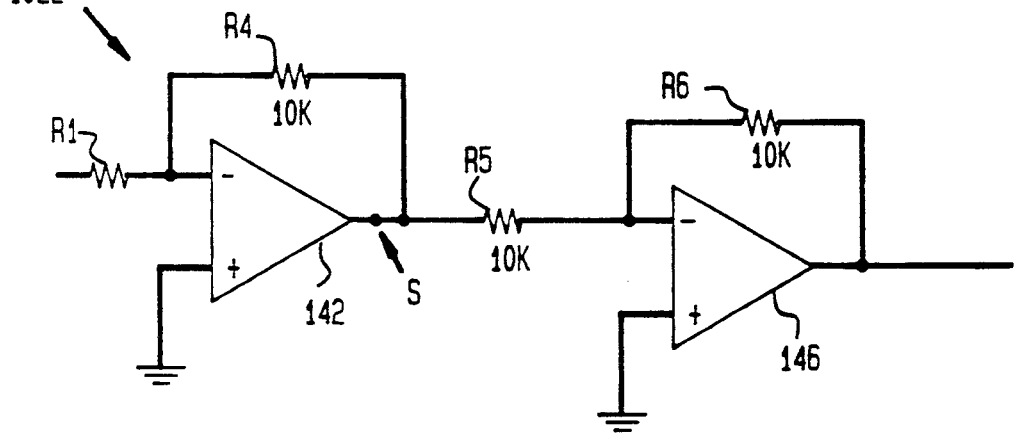
FIGS. 4A and 4B illustrate equivalent circuits to the two states of the tare circuit of the invention.
Figure 4B:
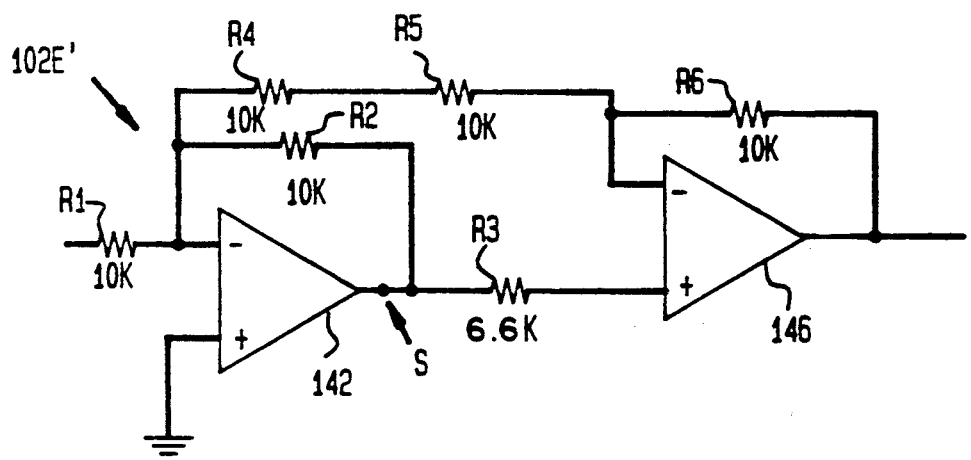
Figure 5A:
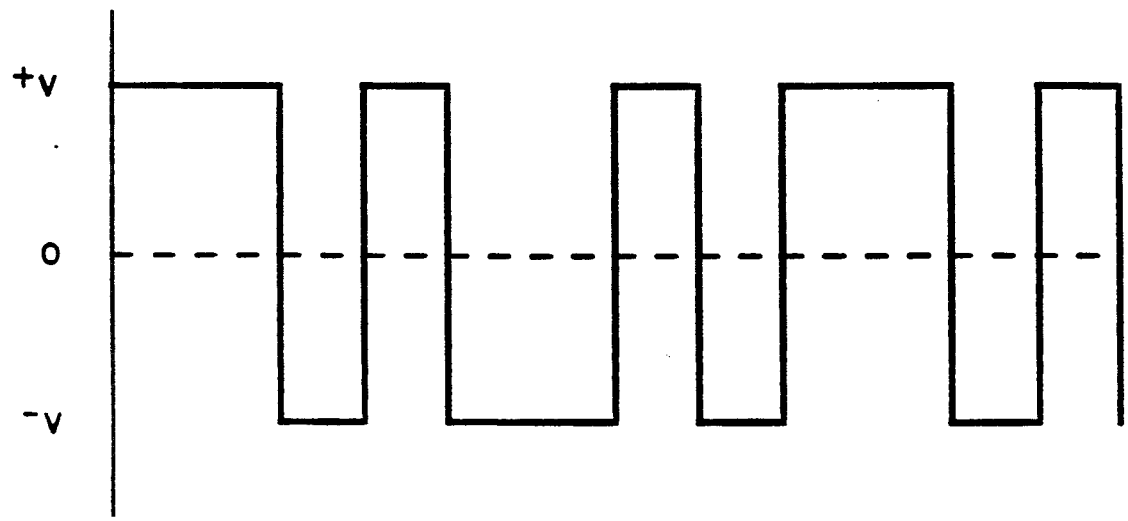
FIGS. 5A-5D are examples of wave forms that may be generated by the circuit of the invention.
Figure 5B:
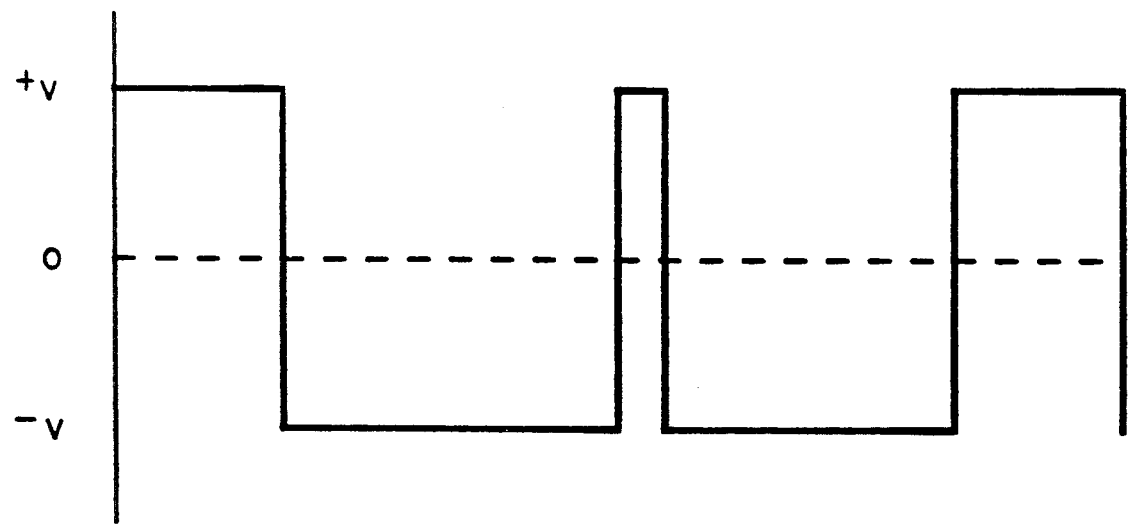
Figure 5C:
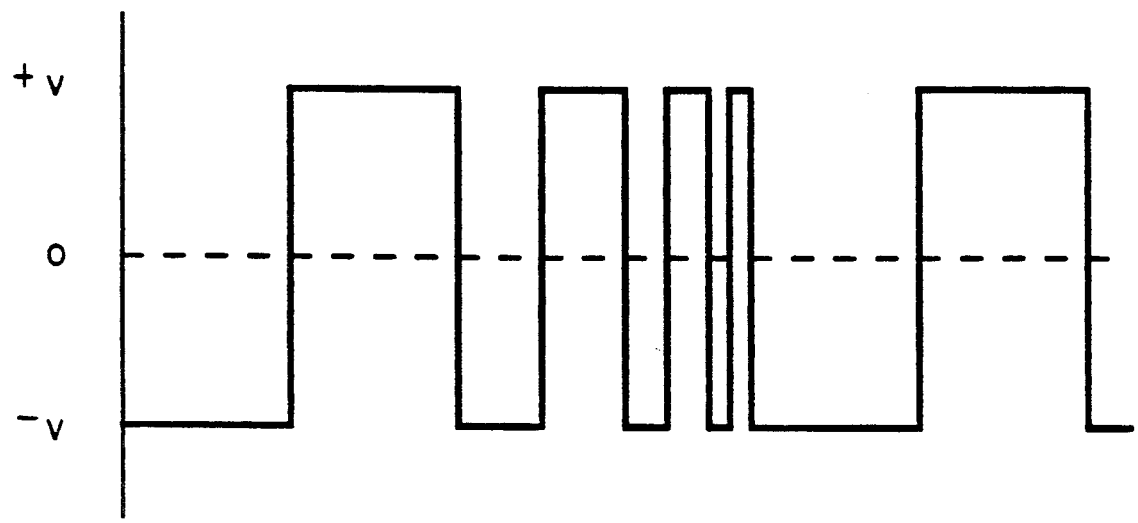
Figure 5D:
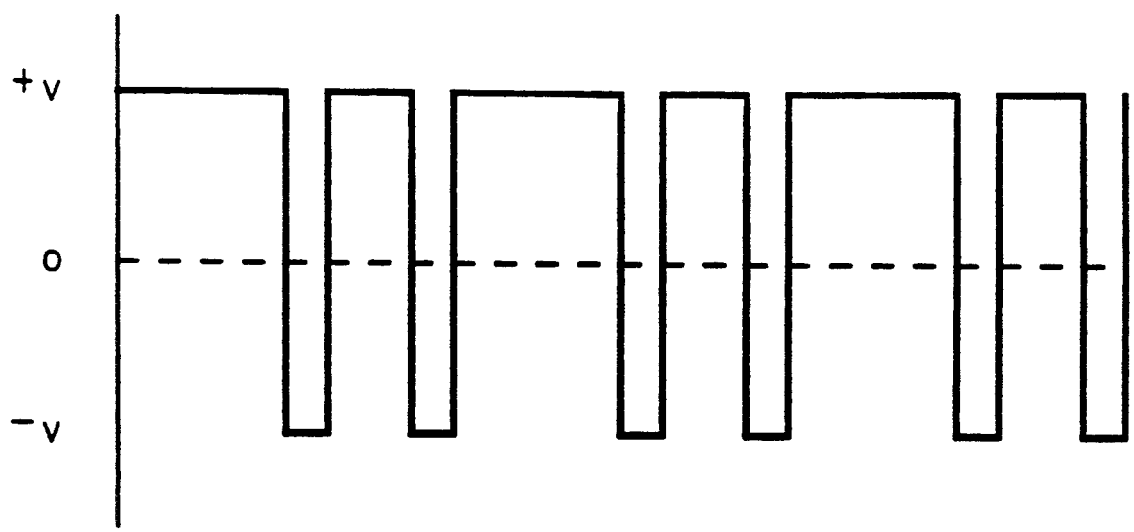

FIG. 4A is an illustration of an equivalent circuit (102E) to modulator 102 when switch 144 is in its first position (shown in FIG. 2A). FIG. 4B is an illustration of an equivalent circuit (102E') to modulator 102 when switch 144 is in its second position.

Referring to FIG. 4A, equivalent circuit 102E is seen to be a two stage amplifier, of which the first stage comprises operational amplifier 142 and resistors R1, R4, while the second stage comprises operational amplifier 146 and resistors R5, R6. The location of switch 144 in equivalent circuit 102E is shown by point S.

The gain for the first stage of circuit 102E is given by gain equation.

$$G_1 = -R4/R1 = -10k/10k = -1$$

The gain for the second stage of circiut 102E is given by $$G_2 = -R6/R5 = -10k/10k = -1$$

The total gain for circiut 102E is therefore $$G_T = G_1 * F_2 = -1 * -1 = 1$$

Turning now to FIG. 4B, equivalent circuit 102E' also is a two stage amplifier. The first stage comprises op amp 142 and resistors R1, R2, R4, R5. The second stage of circuit 102E' comprises op amp 146 and resistors R4, R5, R6. Resistor R3 may be disregarded because of the high input impedance of op amp 146. As in FIG. 4A, the location of switch 144 in equivalent circuit 102E' is shown by point S.

The gain for the first stage of circuit 102E' is given by $$\begin{aligned} G'_1 &= -1/R1 * (((R4 + R5) * R2)/(R4 + R5 + R2)) \\ &= -1/10 * (((10 + 10) * 10)/(10 + 10 + 10)) \\ &= -1/10 * (200/30) = -2/3 \end{aligned}$$

The gain for the second stage of circuit 102E' is given by $$\begin{aligned} G'_2 &= 1 + (R6/(R4 + R5)) \\ &= 1 + (10/(10 + 10)) = +3/2. \end{aligned}$$

The total gain for circuit 102E' is $$G'_T = G'_T * G'_2 = -\tfrac{2}{3} * 3/2 = -1$$

It will be noted that changes in the position of switch 144 change the effective gains of op amps 142, 146.

It will be noted that switch 144, in either position, is within the feed back loop of amplifier 142. This positioning demultiplies the on resistance of switch 144 by amplifier 142's open loop gain, which is a factor of at least five million, thereby improving the precision of the output of modulator 102. Also to be noted is 33pF capacitor 150 which is connected across the output and the inverting input of amplifier 142. Capacitor 150 stabilizes amplifier 142 during transitions of switch 144 (50 nanoseconds worst case). Capacitor 150 also stabilizes the rise and fall time of the square wave output over variations in component characteristics due to time and temperature. Switch 144 repeatedly changes its position in response to timing signals received from driving stage 108. Driving stage 108 (FIG. 2G) comprises D-type flip-flops 132, 134, 136, 138. A 2KHZ clock signal output by microcontroller 106 is buffered by an inverter of IC126 and then received at the clock input of flip-flop 132. Flip-flop 132 is arranged to change state upon each clock pulse. As a result, the output of flip-flop 132 cycles at a rate of 1KHZ. The next state of flip-flop 138 is determined by the current state of flip-flop 132. The exact timing of the change of state of flip-flop 138 is determined by the receipt of clock pulses from microcontroller 106. Flip-flop 138 receives the same 2KHZ clock signal that is applied to the aforesaid inverter of IC 126. Flip-flop 138 outputs a 1KHZ square wave timing signal to modulator 102.

As will be appreciated by those skilled in the art, each positive-going edge and each negative-going edge of the 1KHZ signals output by flip-flop 138 occurs in response to a positive-going edge of the 2KHZ clock signals received by flip-flop 138. This arrangement assures symmetry of the 1KHZ signals output by the flip-flop 138.

As will also be appreciated, the timing signals output by flip-flop 138 may be readily adjusted or changed by microcontroller 106.

In operation, modulator 102 receives a precision 5 volt d.c. potential from reference voltage generator 148 (FIG. 2A). The +5V potential is applied to the inverting input of amplifier 142 through resistor R1. The 1 KHZ timing signal from flip-flop 138 is applied to switch 144. Switch 144 changes its position on each positive and negative edge of the 1KHZ timing signal, so that switch 144 is repeatedly driven between its first and second positions in a 1KHZ cycle. When switch 144 is in its first position, the total gain of modulator 102 is +1, so that the output potential of amplifier 146 (which also may be considered the output of modulator 102) is equal to the input potential +5V. When switch 144 is in its second position, the total gain of modulator 102 is −1 so that the output potential of amplifier 146 is equal to −5V, which is minus one times the input potential. As a result of the 1KHZ timing signal applied to switch 144, the output of modulator 102 is a precision 1KHZ a.c. square wave of amplitude 10 volts, peak to peak.

As described in more detail in the above-referenced application ser. no. 07/619,624, signal demodulator circuit 50 and reference demodulator circuit 70 are alternative preferred embodiments of the circuit of the present invention. Demodulators 50, 70 differ from modulator 102 in that the amplifiers of demodulators 50, 70 have more rapid slew rates that those of modulator 102. Demodulators 50, 70, like modulator 102, receive timing signals from driving stage 108. 1KHZ timing signals output by flip-flops 134, 136 are respectively applied to switches 142', 142" of demodulators 50, 70. The relative timing of the timing signals output by driving stage 108 to circuits 102, 50, 70 is such that demodulators 50, 70 synchronously demodulate a.c. square wave signals, converting those signals into d.c. potentials.

It will be appreciated that there are many alternatives to the heretofore disclosed means for driving switch 144 between its first and second position. For example, instead of timing signals received from timing generator 80, switch 144 may be driven by an oscillator, such as a quartz-crystal oscillator or an LC or RC oscillator. As another example, logic circuitry that outputs a digital square-wave or other wave form could also be used.

As will be recognized by those skilled in the art, there are also many possible alternative embodiments of timing generator 80. For example, input signals received by driving stage 108 could be provided by logic circuitry instead of by microcontroller 106. As another example, microcontroller 106 could be replaced by a conventional microprocessor.

As will be appreciated, it is advantageous for the switch driving means to include programmable means such as microcontroller 106 because of the relative ease with which the circuit of the present invention may thereby be adapted to perform a variety of functions. For example, in the force measuring device disclosed herein, one embodiment of the circuit was used to convert a stable d.c. potential into a precision a.c. square wave, while another embodiment was used to convert an a.c. square wave into a d.c. potential. In addition to the force measuring device disclosed herein, the aforesaid embodiments may find application, for instance, with a thermistor bridge, with a linear variable differential transformer or in a pressure or strain measuring device.

Other uses of said circuit can readily be achieved by programming the programmable means to provide appropriate timing signals. FIGS. 5A–5D illustrate examples of the varieties of rectangular wave forms that could be generated from a stable d.c. input using the circuit of this invention.

The circuit could also be used to synchronously demodulate such relatively complicated wave forms as those shown in FIGS. 5A–5D, thereby converting them into a d.c. potential.

One possible application for such modulation and demodulation would be in the field of communications security. For example, a signal potential that is to be "scrambled" is input to a modulator circuit that would convert a constant potential into an arbitrary wave form such as one of those shown in FIGS. 5A–5D. The scrambled signal is then transmitted. The receiving instrument includes a demodulator circuit that is controlled to synchronously reverse the scrambling effect of the modulator. A series of coded timing pulses or the like is transmitted and received to allow synchronization of the demodulator with the received signal.

The circuit of this invention could also be used as a square wave frequency multiplier. For example, use of the circuit to multiply a square wave's frequency by two is illustrated by reference to FIG. 6. Wave form 210 represents an a.c. square wave input signal having a peak to peak amplitude of twice v and a period of 1/f, corresponding to a frequency of f. If, as shown by wave form 220, the switch of the circuit is driven in a cycle of frequency f, 90° out of phase with input wave form 210, the output signal will have wave form 230, with a period of ½F, and a frequency pf 2F.

Figure 6:
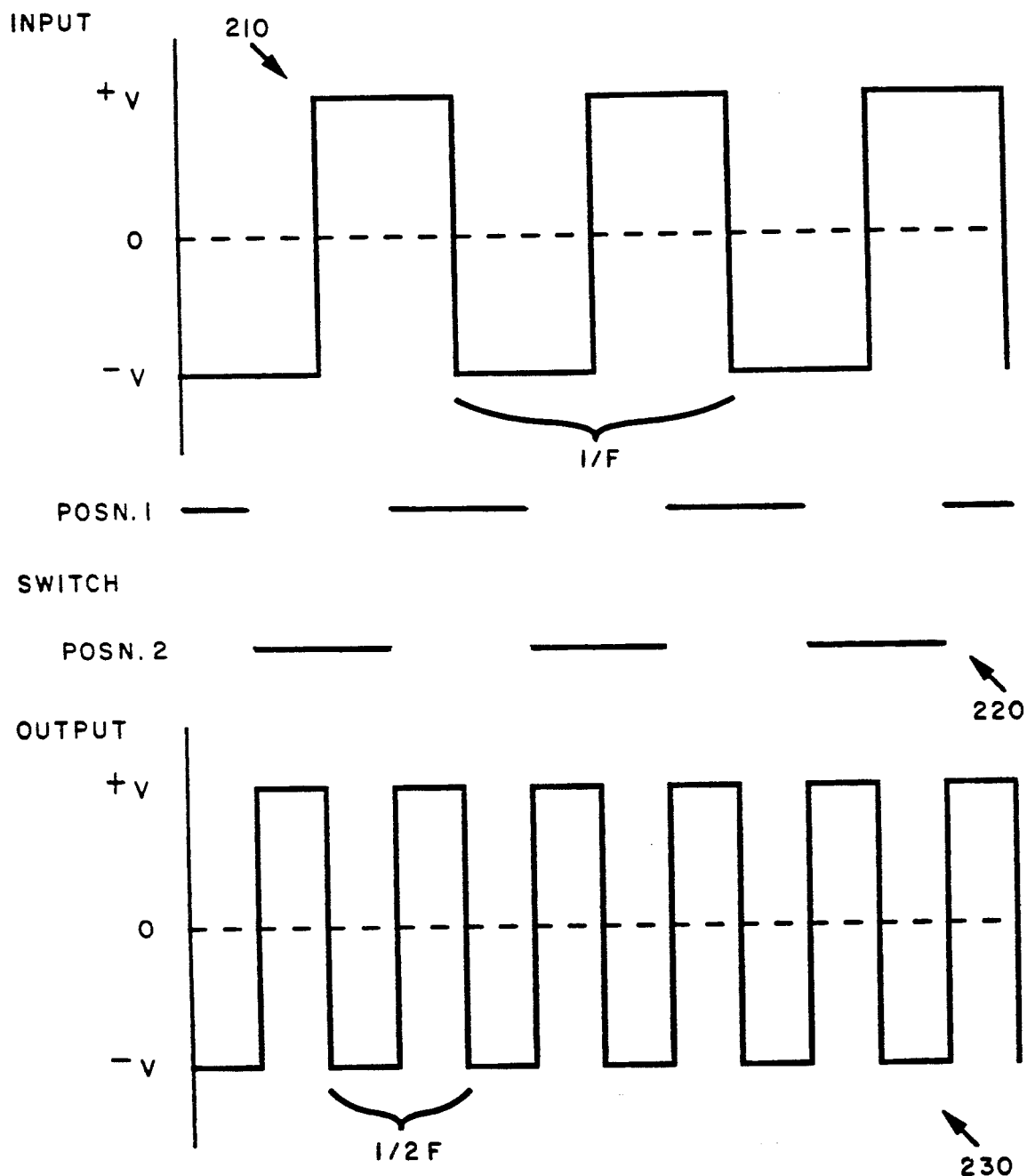
FIG. 6 is a wave form illustration of use of the circuit of the invention as a frequency multiplying circuit.
Figure 7:
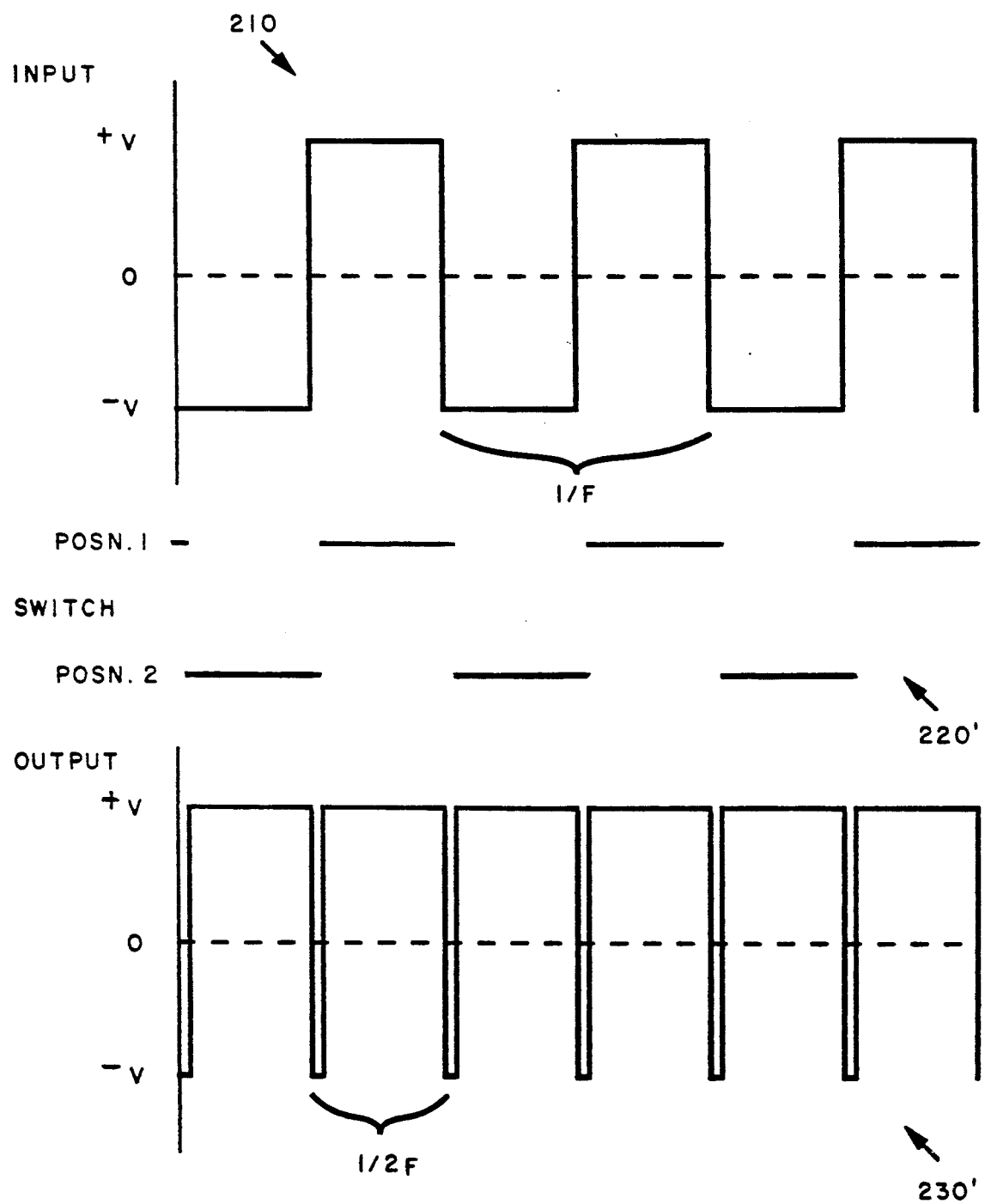
FIG. 7 is a wave form illustration of use of the circuit of the invention as a pulse train generating circuit.

A variation on the application of FIG. 6 is illustrated in FIG. 7, wherein input wave form 210 is the same as in FIG. 6, but the switch position wave form 220' is out of phase with wave form 210 only by a small amount, say 15°. The resulting output wave form 230' again has a frequency of 2f, but is not a square wave. Rather, wave form 230' is at +v most of the time, with a train of −v pulses. It will be appreciated that suitable programming of timing signals or other signal modulation means would allow the circuit of this invention to be applied to pulse code modulation, pulse width modulation, pulse position modulation or other communication schemes.

As will be recognized by those skilled in the art, there are many other possible applications for the circuit of this invention, including cascades of such circuits. If amplifying stages of other than unity gain were interspersed in such a cascade, quite complicated step-function wave forms could be produced.

It is to be understood that the embodiments described above are not to be considered as limiting and limitations on the subject invention are to be found only in the attached claims.

I claim:

1. A circiut for modulating or demodulating an input potential, comprising:

(a) first amplifying means for receiving said input potential and outputting an intermediate output potential;

(b) second amplifying means for receiving said intermediate output potential and outputting a final output potential;

(c) a resistor network connected to said first and second amplifying means, said network comprising a first resistor, a second resistor, a third resistor, a fourth resistor, a fifth resistor and a sixth resistor, each of said resistors having a first terminal and a second terminal;

(d) switching means having a first position and a second position said switching means being connected to said resistor network and to said first amplifying means; and (e) means connected to said switching means for repeatedly driving said switching means between said first position and said second position;

each of said amplifying means having an inverting input terminal, a non-inverting input terminal and an output terminal; said non-inverting input terminal of said first amplifier means being coupled to a ground potential; said first terminal of said first resistor being connected to a source of said input potential, said second terminal of said first resistor being connected to said inverting input terminal of said first amplifying means, said second terminal of said second resistor being connected to said first terminal of said third resistor, said second terminal of said third resistor being connected to said inverting input of said second amplifying means; said first terminal of said fourth resistor being connected to said inverting input terminal of said second amplifying means, said said second terminal of said fourth resistor being connected to said output terminal of said second amplifying means; said first terminal of said fifth resistor being connected to said inverting input terminal of said first amplifying means; said second terminal of said fifth resistor being connected to said first terminal of said sixth resistor, said second terminal of said sixth resistor being connected to said non-inverting input terminal of said second amplifying means; said second terminal of said second resistor being connected via said switching means to said output terminal of said first amplifying means only when said switching means is in said first position; said second terminal of said fifth resistor being connected via said switching means to said output terminal of said first amplifying means only when said switching means is in said second position; said inverting input terminal of said second amplifying means receiving said intermediate output potential only when said switching means is in said first position; said non-inverting input terminal of said second amplifying means receiving said intermediate output potential only when said switching means is in said second position; said resistors providing resistances so that said final output potential equals said input potential when said switching means is in said first position and said final output potential equals minus one times said input potential when said switching means is in said second position.

2. The circuit of claim 1, wherein said first amplifying means comprises a first high-gain operational amplifier and said second amplifying means comprises a second high-gain operational amplifier.

3. The circuit of claim 2, wherein said switching means comprises field effect transistor (FET) switch means.

4. The circuit of claim 3, wherein said FET switch means is enclosed within a feedback loop of said first operational amplifier.

5. The circiut of claim 4, wherein said driving means comprises a microcontroller for generating timing signals.

6. The circuit of claim 5, wherein said input potential is a stable d.c. voltage and said final output potential is an a.c. square wave.

7. The circuit of claim 5, wherein said input potential is an a.c. square wave and said final output potential is a d.c. voltage.

8. The circiut of claim 1, wherein said driving means comprises a microcontroller for generating timing signals.

9. The circiut of claim 8, wherein said input potential is a stable d.c. voltage and said final output potential is an a.c. square wave.

10. The circiut of claim 8, wherein said input potential is an a.c. square wave and said final output potential is d.c. voltage.

11. The circiut of claim 1, wherein said input potential is a stable d.c. voltage and said final output potential is an a.c. square wave.

12. The circiut of claim 1, wherein said input potential is an a.c. square wave and said final output potential is a d.c. voltage.

13. The circiut of claim 1, wherein said switching means is enclosed within a feedback loop of said first amplifying means.

14. A circiut for selectively inverting or following an input potential, said circiut comprising:

(a) first amplifying means for receiving said input potential and outputting an intermediate output potential;

(b) second amplifying means for receiving said intermediate output potential and for outputting a final output potential;

(c) a resistor network connected to said first and second amplifying means, said network comprising a first resistor, a second resistor, a third resistor, a fourth resistor, a fifth resistor and a sixth resistor, each of said resistors having a first terminal and a second terminal; and (d) switching means having a first position and a second position, said switching means being connected to said resistor network and to said first amplifying means;

each of said amplifying means having an inverting input terminal, a non-inverting input terminal and an output terminal; said non-inverting input terminal of said first amplifier means being coupled to a ground potential; said first terminal of said first resistor being connected to a source of said input potential, said second terminal of said first resistor being connected to said inverting input terminal of said first amplifying means; said first terminal of said second resistor being connected to said inverting input terminal of said first amplifying means, said second terminal of said second resistor being connected to said first terminal of said third resistor, said second terminal of said third resistor being connected to said inverting input of said second amplifying means; said first terminal of said fourth resistor being connected to said inverting input terminal of said second amplifying means, said said second terminal of said forth resistor being connected to said output terminal of said second amplifying means; said first terminal of said fifth resistor being connected to said inverting input terminal of said first amplifying means; said second terminal f said fifth resistor being connected to said first terminal of said sixth resistor, said second terminal of said sixth resistor being connected to said non-inverting input terminal of said second amplifying means; said second terminal of said second resistor being connected via said switching means to said output terminal of said first amplifying means only when said switching means is in said first position; said second terminal of said fifth resistor being connected via said switching means to said output terminal of said first amplifying means only when said switching means is in said second position; said inverting input terminal of said second amplifying means receiving said intermediate output potential only when said switching means is in said first position; said non-inverting input terminal of said second amplifying means receiving said intermediate output potential only when said switching means is in said second position; said resistors providing resistances so that said final output potential follows said input potential when said switching means is in said first position and said circiut inverts said input potential when said switching means is in said second position.

15. The circiut of claim 14, further comprising means connected to said switching means for repeatedly driving said switching means between said first position and said second position.

16. The circiut of claim 15, wherein said input potential is a stable d.c. voltage and said final output potential is an a.c. square wave.

17. The circiut of claim 15, wherein said input potential is an a.c. square wave and said final output potential is a d.c. voltage.

18. The circiut of claim 15, wherein said driving means comprises a micro-controller for generating timing signals.

19. The circiut of claim 14, wherein said first amplifying means comprises a first operational amplifier, said second amplifying means comprises a second operational amplifier and said switching means is enclosed within a feedback loop of said first operational amplifier.

20. The circiut of claim 19, wherein said switching means comprises FET switch means.

21. The circiut of claim 20, further comprising means connected to said switching means for repeatedly driving said switching means between said first positions and said second position.

22. The circiut of claim 21, wherein said driving means comprises a micro-controller for generating timing signals.

* * * * *